(12) United States Patent
Richieri

(10) Patent No.: US 9,627,552 B2
(45) Date of Patent: Apr. 18, 2017

(54) MOLYBDENUM BARRIER METAL FOR SIC SCHOTTKY DIODE AND PROCESS OF MANUFACTURE

(75) Inventor: Giovanni Richieri, Via San Pancrazio (IT)

(73) Assignee: VISHAY-SILICONIX, Santa Clara, CA (US)

( * ) Notice: Subject to any disclaimer, the term of this patent is extended or adjusted under 35 U.S.C. 154(b) by 111 days.

(21) Appl. No.: 11/888,452

(22) Filed: Jul. 31, 2007

(65) Prior Publication Data

US 2008/0237608 A1   Oct. 2, 2008

Related U.S. Application Data

(60) Provisional application No. 60/820,807, filed on Jul. 31, 2006.

(51) Int. Cl.
| | | |
|---|---|---|
| H01L 21/28 | (2006.01) | |
| H01L 21/44 | (2006.01) | |
| H01L 29/872 | (2006.01) | |
| H01L 29/16 | (2006.01) | |
| H01L 29/47 | (2006.01) | |
| H01L 29/66 | (2006.01) | |
| H01L 29/06 | (2006.01) | |

(52) U.S. Cl.
CPC ........ *H01L 29/872* (2013.01); *H01L 29/1608* (2013.01); *H01L 29/47* (2013.01); *H01L 29/6606* (2013.01); *H01L 29/0619* (2013.01)

(58) Field of Classification Search
CPC ............. H01L 29/872; H01L 29/66863; H01L 29/66143; H01L 21/28587

USPC .......... 438/105, 931, 570, 571, 582; 257/77, 257/471–473, 483, 484
See application file for complete search history.

(56) References Cited

U.S. PATENT DOCUMENTS

| | | | |
|---|---|---|---|
| 4,036,672 A | | 7/1977 | Kobayashi |
| 4,206,540 A | | 6/1980 | Gould |
| 4,618,871 A | * | 10/1986 | Mitlehner ............. H01L 29/872 257/483 |
| 4,648,175 A | * | 3/1987 | Metz, Jr. et al. ............. 438/301 |
| 4,672,738 A | | 6/1987 | Stengl et al. |
| 4,796,084 A | | 1/1989 | Kamasaki et al. |
| 4,862,244 A | * | 8/1989 | Yamagishi .................... 257/484 |
| 4,903,189 A | | 2/1990 | Ngo et al. |
| 4,990,994 A | * | 2/1991 | Furukawa et al. ............ 257/763 |

(Continued)

FOREIGN PATENT DOCUMENTS

| | | |
|---|---|---|
| DE | 19840032 | 11/1999 |
| DE | 100 02 362 | 8/2001 |

(Continued)

OTHER PUBLICATIONS

International Search Report for PCT/US05/38118 dated Feb. 6, 2007.

(Continued)

*Primary Examiner* — Lex Malsawma
*Assistant Examiner* — Eric Jones

(57) ABSTRACT

A method for fabricating a diode is disclosed. In one embodiment, the method includes forming a Schottky contact on an epitaxial layer of silicon carbide (SiC) and annealing the Schottky contact at a temperature in the range of 300° C. to 700° C. The Schottky contact is formed of a layer of molybdenum.

24 Claims, 5 Drawing Sheets

(56) References Cited

U.S. PATENT DOCUMENTS

| | | | |
|---|---|---|---|
| 5,003,372 A | 3/1991 | Kim et al. | |
| 5,047,833 A | 9/1991 | Gould | |
| 5,113,237 A | 5/1992 | Stengl | |
| 5,233,215 A | 8/1993 | Baliga | |
| 5,323,040 A | 6/1994 | Baliga | |
| 5,362,975 A | 11/1994 | von Windheim et al. | |
| 5,384,470 A | 1/1995 | Tachibana et al. | |
| 5,436,174 A | 7/1995 | Baliga et al. | |
| 5,527,745 A * | 6/1996 | Dixit et al. ................ | 438/600 |
| 5,689,128 A | 11/1997 | Hshieh et al. | |
| 5,712,502 A | 1/1998 | Mitlehner et al. | |
| 5,747,831 A | 5/1998 | Loose et al. | |
| 5,753,938 A | 5/1998 | Thapar et al. | |
| 5,789,311 A | 8/1998 | Ueno et al. | |
| 5,801,836 A | 9/1998 | Bakowski et al. | |
| 5,914,500 A | 6/1999 | Bakowski et al. | |
| 5,915,179 A * | 6/1999 | Etou et al. ................ | 438/268 |
| 5,932,894 A | 8/1999 | Bakowski et al. | |
| 5,977,605 A | 11/1999 | Bakowsky et al. | |
| 6,040,237 A | 3/2000 | Bakowski et al. | |
| 6,040,600 A | 3/2000 | Uenishi et al. | |
| 6,040,617 A | 3/2000 | Patel | |
| 6,100,572 A * | 8/2000 | Kinzer ...................... | 257/492 |
| 6,150,246 A | 11/2000 | Parsons | |
| 6,177,712 B1 * | 1/2001 | Miyasaka .................. | 257/484 |
| 6,207,591 B1 * | 3/2001 | Aoki et al. ................ | 438/795 |
| 6,229,194 B1 | 5/2001 | Lizotte | |
| 6,303,986 B1 | 10/2001 | Shook | |
| 6,320,205 B1 | 11/2001 | Pfirsch et al. | |
| 6,330,967 B1 | 12/2001 | Milewski et al. | |
| 6,353,252 B1 | 3/2002 | Yasuhara et al. | |
| 6,362,495 B1 | 3/2002 | Schoen et al. | |
| 6,373,076 B1 | 4/2002 | Alok et al. | |
| 6,410,958 B1 | 6/2002 | Usui et al. | |
| 6,432,750 B2 | 8/2002 | Jeon et al. | |
| 6,441,455 B1 | 8/2002 | Dutta | |
| 6,498,368 B2 | 12/2002 | Sakamoto et al. | |
| 6,509,240 B2 | 1/2003 | Ren et al. | |
| 6,514,782 B1 | 2/2003 | Wierer, Jr. et al. | |
| 6,562,647 B2 | 5/2003 | Zandman et al. | |
| 6,573,534 B1 | 6/2003 | Kumar et al. | |
| 6,573,537 B1 | 6/2003 | Steigerwald et al. | |
| 6,586,801 B2 | 7/2003 | Onishi et al. | |
| 6,605,862 B2 | 8/2003 | Van Dalen et al. | |
| 6,621,122 B2 | 9/2003 | Qu | |
| 6,622,380 B1 | 9/2003 | Grigg | |
| 6,624,522 B2 | 9/2003 | Standing et al. | |
| 6,630,698 B1 | 10/2003 | Deboy et al. | |
| 6,635,944 B2 | 10/2003 | Stoisiek | |
| 6,673,662 B2 | 1/2004 | Singh | |
| 6,674,126 B2 | 1/2004 | Iwamoto et al. | |
| 6,683,347 B1 | 1/2004 | Fujihira | |
| 6,700,141 B2 | 3/2004 | Iwamoto et al. | |
| 6,713,813 B2 | 3/2004 | Marchant | |
| 6,740,931 B2 | 5/2004 | Okumura et al. | |
| 6,762,455 B2 | 7/2004 | Oppermann et al. | |
| 6,764,906 B2 | 7/2004 | Darwish | |
| 6,768,170 B2 | 7/2004 | Zhou | |
| 6,791,167 B2 | 9/2004 | Hayashi et al. | |
| 6,812,282 B2 | 11/2004 | Chang et al. | |
| 6,828,609 B2 | 12/2004 | Deboy et al. | |
| 6,844,571 B2 | 1/2005 | Krames et al. | |
| 6,849,900 B2 | 2/2005 | Aida et al. | |
| 6,897,133 B2 | 5/2005 | Collard | |
| 6,936,850 B2 | 8/2005 | Friedrichs et al. | |
| 6,949,454 B2 | 9/2005 | Swanson et al. | |
| 6,960,829 B2 | 11/2005 | Hogerl | |
| 6,979,862 B2 | 12/2005 | Henson | |
| 6,992,340 B2 | 1/2006 | Tanaka | |
| 7,034,376 B2 * | 4/2006 | Okada et al. ................ | 257/471 |
| 7,073,890 B2 | 7/2006 | Cabal et al. | |
| 7,166,890 B2 | 1/2007 | Sridevan | |
| 7,173,284 B2 | 2/2007 | Kumar et al. | |
| 7,262,434 B2 | 8/2007 | Okamura et al. | |
| 7,265,045 B2 | 9/2007 | Lee et al. | |
| 7,265,388 B2 | 9/2007 | Fukuda et al. | |
| 7,299,538 B2 | 11/2007 | Tactic-Lucic | |
| 7,315,081 B2 | 1/2008 | Standing | |
| 7,384,826 B2 * | 6/2008 | Richieri ............ | H01L 29/417 |
| | | | 257/E29.012 |
| 7,394,158 B2 | 7/2008 | Carta et al. | |
| 7,411,218 B2 | 8/2008 | Seng et al. | |
| 7,492,003 B2 | 2/2009 | Kinzer | |
| 7,507,650 B2 | 3/2009 | Nakamura et al. | |
| 7,649,213 B2 | 1/2010 | Hatakeyama et al. | |
| 7,687,907 B2 | 3/2010 | Okuda et al. | |
| 7,718,470 B2 | 5/2010 | Hsu | |
| 7,777,292 B2 * | 8/2010 | Ota et al. ................ | 257/472 |
| 7,812,441 B2 | 10/2010 | Carta et al. | |
| 7,834,376 B2 | 11/2010 | Carta et al. | |
| 8,368,165 B2 * | 2/2013 | Richieri ................ | 257/473 |
| 8,368,211 B2 | 2/2013 | Standing et al. | |
| 8,368,223 B2 | 2/2013 | Standing | |
| 2001/0043172 A1 | 11/2001 | McGrath et al. | |
| 2001/0052601 A1 | 12/2001 | Onishi et al. | |
| 2002/0063281 A1 | 5/2002 | Tihanyl | |
| 2002/0064930 A1 | 5/2002 | Ishikawa | |
| 2002/0076851 A1 | 6/2002 | Eden et al. | |
| 2002/0109211 A1 | 8/2002 | Shinohara | |
| 2002/0171087 A1 | 11/2002 | Krames et al. | |
| 2002/0179909 A1 | 12/2002 | Uchida et al. | |
| 2003/0006425 A1 * | 1/2003 | Bol et al. ................ | 257/127 |
| 2003/0042538 A1 | 3/2003 | Kumar et al. | |
| 2003/0075783 A1 | 4/2003 | Yoshihara et al. | |
| 2003/0119300 A1 | 6/2003 | Chiu et al. | |
| 2003/0127747 A1 | 7/2003 | Kajiwara et al. | |
| 2003/0162355 A1 | 8/2003 | Sankin et al. | |
| 2003/0168734 A1 | 9/2003 | Fang | |
| 2003/0176031 A1 | 9/2003 | Onishi et al. | |
| 2003/0183895 A1 * | 10/2003 | Okamura et al. ............ | 257/454 |
| 2004/0012930 A1 | 1/2004 | Grigg | |
| 2004/0051118 A1 | 3/2004 | Bruhns et al. | |
| 2004/0063240 A1 | 4/2004 | Madrid et al. | |
| 2004/0070060 A1 | 4/2004 | Mamitsu et al. | |
| 2004/0104489 A1 | 6/2004 | Larking | |
| 2004/0110330 A1 | 6/2004 | Collard | |
| 2004/0113264 A1 | 6/2004 | Akerling et al. | |
| 2004/0135178 A1 | 7/2004 | Onose et al. | |
| 2004/0145380 A1 | 7/2004 | Babcock et al. | |
| 2004/0150040 A1 | 8/2004 | Nitta et al. | |
| 2004/0169262 A1 | 9/2004 | Oliver et al. | |
| 2004/0207092 A1 | 10/2004 | Burrell et al. | |
| 2004/0212011 A1 | 10/2004 | Ryu | |
| 2004/0212093 A1 | 10/2004 | Chopra et al. | |
| 2004/0245570 A1 | 12/2004 | Ninomiya | |
| 2004/0262685 A1 | 12/2004 | Zingg | |
| 2005/0012143 A1 | 1/2005 | Tanaka et al. | |
| 2005/0023680 A1 | 2/2005 | Wang et al. | |
| 2005/0029557 A1 | 2/2005 | Hatakeyama et al. | |
| 2005/0034888 A1 | 2/2005 | Hoffmann et al. | |
| 2005/0067630 A1 | 3/2005 | Zhao | |
| 2005/0072984 A1 | 4/2005 | Kwak et al. | |
| 2005/0077615 A1 | 4/2005 | Yu et al. | |
| 2005/0082570 A1 | 4/2005 | Sridevan | |
| 2005/0082611 A1 | 4/2005 | Peake et al. | |
| 2005/0091988 A1 | 5/2005 | Stewart et al. | |
| 2005/0116344 A1 | 6/2005 | Humpston | |
| 2005/0136635 A1 | 6/2005 | Savastiouk et al. | |
| 2005/0139947 A1 * | 6/2005 | Okada et al. ................ | 257/480 |
| 2005/0200011 A1 | 9/2005 | Standing et al. | |
| 2005/0230715 A1 | 10/2005 | Hoshino et al. | |
| 2005/0253168 A1 | 11/2005 | Wu et al. | |
| 2006/0003514 A1 | 1/2006 | Richieri | |
| 2006/0065899 A1 | 3/2006 | Hatakeyama et al. | |
| 2006/0086939 A1 | 4/2006 | Carta et al. | |
| 2006/0145283 A1 * | 7/2006 | Zhu et al. ................ | 257/472 |
| 2006/0145319 A1 | 7/2006 | Sun et al. | |
| 2006/0214242 A1 | 9/2006 | Carta et al. | |
| 2006/0220027 A1 | 10/2006 | Takahashi et al. | |
| 2006/0226504 A1 | 10/2006 | Hatakeyama et al. | |
| 2006/0255423 A1 | 11/2006 | Ryu et al. | |
| 2007/0222025 A1 | 9/2007 | Husain et al. | |
| 2007/0228505 A1 * | 10/2007 | Mazzola et al. ............ | 257/471 |
| 2008/0237608 A1 | 10/2008 | Richieri | |

(56) References Cited

U.S. PATENT DOCUMENTS

| | | |
|---|---|---|
| 2008/0286968 A1 | 11/2008 | Carta et al. |
| 2009/0067630 A1 | 3/2009 | Daemen et al. |
| 2009/0104738 A1 | 4/2009 | Ring et al. |
| 2010/0068855 A1 | 3/2010 | Saxler et al. |
| 2011/0248284 A1 | 10/2011 | Carta et al. |
| 2011/0278591 A1 | 11/2011 | Carta et al. |
| 2014/0042459 A1 | 2/2014 | Richieri |

FOREIGN PATENT DOCUMENTS

| | | |
|---|---|---|
| EP | 0402296 | 12/1990 |
| EP | 0604194 | 6/1994 |
| EP | 0681326 A2 | 11/1995 |
| EP | 0958923 A2 | 11/1999 |
| EP | 1349202 A2 | 1/2003 |
| EP | 1739753 A1 | 1/2007 |
| EP | 1739753 A1 | 3/2007 |
| FR | 2579023 | 9/1986 |
| JP | S61-240679 | 10/1986 |
| JP | S62-46561 | 2/1987 |
| JP | H07-245402 | 9/1995 |
| JP | 7302896 | 11/1995 |
| JP | H08-55908 | 2/1996 |
| JP | H08-55920 | 2/1996 |
| JP | H08-195488 | 7/1996 |
| JP | 09-036393 | 2/1997 |
| JP | 11087690 | 3/1999 |
| JP | 11087698 | 3/1999 |
| JP | 11348355 | 12/1999 |
| JP | 2000-022178 | 1/2000 |
| JP | 2001313391 | 11/2001 |
| JP | 2002-118268 | 4/2002 |
| JP | 2002158363 | 5/2002 |
| JP | 2002261295 | 9/2002 |
| JP | 2003074951 | 3/2003 |
| JP | 2003258271 A | 9/2003 |
| JP | 2003273127 | 9/2003 |
| JP | 2004079988 | 3/2004 |
| JP | 2004-111759 | 4/2004 |
| JP | 2004099898 | 4/2004 |
| JP | 2004-221513 | 8/2004 |
| JP | 2005079339 A | 3/2005 |
| JP | 2005-251786 | 9/2005 |
| JP | 2005286197 A | 10/2005 |
| JP | 2005-311347 | 11/2005 |
| JP | 2006-100593 | 4/2006 |
| WO | 97/27626 | 7/1997 |
| WO | 0038242 | 6/2000 |
| WO | 0143172 | 6/2001 |
| WO | 03038906 | 5/2003 |
| WO | 2005091988 | 10/2005 |
| WO | 2005093840 A1 | 10/2005 |
| WO | 2006047382 A2 | 5/2006 |
| WO | 2006074382 | 7/2006 |

OTHER PUBLICATIONS

Fukuda Kenji, et al., Espacenet Bibliographic Data: Abstract of JP2005079339 (A), Mar. 24, 2005, 2 pages, European Patent Office, http://worldwide.espacenet.com.

Maeyama Yusuke, et al., Espacenet Bibliographic Data: Abstract of JP2005286197 (A), Oct. 13, 2005, 2 pages, European Patent Office, http://worldwide.espacenet.com.

Nakamura et al., "A 4.15 kV 9.07-mΩ•cm2 4H-SiC Schottky-Barrier Diode Using Mo Contact Annealed at High Temperature," IEEE Electron Device Letters, vol. 26, No. 2, Feb. 2005, pp. 99-101, IEEE.

* cited by examiner

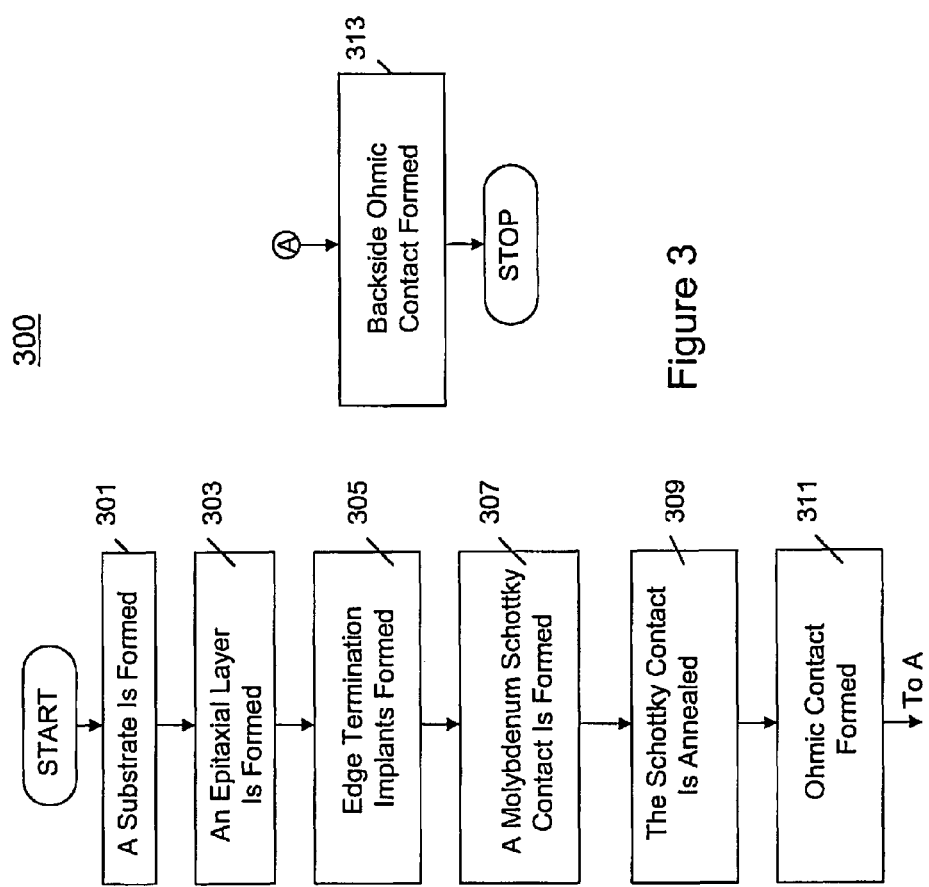

MOLYBDENUM BARRIER METAL FOR SIC SCHOTTKY DIODE AND PROCESS OF MANUFACTURE

RELATED U.S. APPLICATIONS

This application claims priority to provisional application Ser. No. 60/820,807 filed on Jul. 31, 2006, which is hereby incorporated by reference to this specification.

FIELD OF THE INVENTION

This invention relates to a silicon carbide (SiC) Schottky diode with a molybdenum Schottky barrier contact.

BACKGROUND

A diode is an electronic component that restricts the direction of flow of electric current. More specifically, it allows electric current to flow in one direction, but blocks electric current flow in the opposite direction. Accordingly, a diode can be thought of as an electronic version of a mechanical check valve. Circuits that require current flow in only one direction typically include one or more diodes.

Schottky diodes are diodes that are formed from the contact between a metal and a semiconductor rather than from a p-n junction. They have a lower forward voltage drop than a standard p-n junction diode. Schottky diodes generally have much lower junction capacitance than p-n junction diodes. The lower junction capacitance contributes to their high switching speed and their suitability for high speed circuits and radio frequency (RF) devices such as mixers and detectors. In addition, Schottky diodes may be used in high voltage applications.

For use in high voltage applications, Schottky diode manufacturers seek to provide devices that have superior properties for reducing power loss. Parameters used by manufacturers to assess the performance of such diodes include forward current conduction and reverse voltage blocking characteristics. Devices that provide high forward current conduction and a high blocking voltage are ideal for high voltage, low loss applications. Challenges to the successful manufacture of such devices include intrinsic properties of the materials used to fabricate the devices and physical defects that may be present in those materials.

Silicon Carbide (SiC) has emerged as a promising material for high-voltage and low-loss power semiconductor devices because of its high critical electric field. Moreover, Schottky barrier diodes (SBDs) that use SiC are currently commercially available. However, these devices demonstrate poor performance in comparison with the ideal performance potential of SiC. More specifically, currently available SiC-SBDs do not fully realize the high performance (high-voltage, high current capacity, and low-loss) potential of SiC. In addition, currently available SiC-SBDs exhibit performance degrading defects in the SiC epilayer of high-voltage versions.

SUMMARY OF THE INVENTION

Accordingly, a need exists for a method of providing Schottky diodes with improved forward current conduction and reverse voltage blocking capacity. The present invention provides a method and that accomplishes this need.

A molybdenum Schottky contact is disclosed that provides an improvement, as compared to titanium and other potential Schottky contact materials, in forward current conduction and reverse voltage blocking performance. Additionally, the molybdenum Schottky contact provides greater device operating stability at high temperatures and allows a higher annealing temperature than does SiC Schottky diodes that use titanium (Ti) or nickel (Ni) Schottky contacts.

Additionally, a method for fabricating a diode is disclosed. The method includes forming a Schottky contact on an epitaxial layer of silicon carbide (SiC) and annealing the Schottky contact at a temperature in the range of 300 to 700° C. The Schottky contact is formed of a layer of molybdenum (Mo).

As a part of a disclosed method for fabricating a diode a substrate is formed, an epitaxial layer is formed on the substrate and an edge termination implant is formed in a termination region of the epitaxial layer. In addition, a Schottky contact is formed on the epitaxial layer and the Schottky contact is annealed at a temperature in excess of 600° C. Thereafter, an aluminum (Al) contact layer is formed above the Schottky contact. The Schottky contact is formed of a layer of molybdenum (Mo).

Also disclosed is a Schottky diode fabricated in accordance with processes described herein. In one embodiment the Schottky diode includes a substrate, an epitaxial layer located adjacent to and above the substrate, a field ring formed in a termination region of the epitaxial layer and a Schottky contact formed on the epitaxial layer. The Schottky contact is formed of a layer of molybdenum. An aluminum layer is formed above the Schottky contact.

In one embodiment, a high temperature (>600° C.) annealed Molybdenum (Mo) Schottky contact is disclosed that has superior properties (for instance, Schottky barrier height=1.2-1.3 eV and ideality factor<1.1) for reduction of power loss in a high-voltage SiC-SBD. The Schottky barrier height indicates the difference of potentials at an interface between a metal and a semiconductor. This parameter is important in the determination of device forward voltage and leakage current. The ideality factor provides a measure of the quality of the interface. In general, the ideality factor is from 1 to 2, this parameter being below 1.1 in a high quality interface such as the molybdenum Schottky contact disclosed herein.

In one embodiment, electronic power devices such as 4H—SiC junction-barrier Schottky diodes that include a Schottky contact as disclosed herein may be fabricated on 3 inch diameter 4H—SiC wafers. Schottky metal contacts may be obtained by sputtering or better by e-beam and thermal evaporation of Ti, Mo and Ni.

In one embodiment, the disclosed Schottky diode exhibits a blocking voltage of up to 1000V at room temperature and in the range of 77-400° K. In one embodiment, characteristics of the Schottky diode were evaluated with reference to current—voltage and capacitance—voltage measurements. The Schottky Barrier heights (SBH), the ideality factors, and the reverse leakage current on different designs, were measured and a morphological study related to the structure of failed devices was performed by high resolution scanning electron microscopy.

In one embodiment, Schottky barrier diodes with Mo as the Schottky barrier exhibit a blocking voltage similar to that obtained by standard Ti metallization but with a lower height barrier value. A consequence of the lower barrier value is a better performance in forward conduction as is shown in FIG. 2A as well as in reverse or blocking voltage as shown in FIG. 2B. Moreover, junction barrier Schottky diodes limit the electric field strength on the Schottky barrier and thus limit Schottky barrier lowering and reverse current flow.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The invention, together with further advantages thereof, may best be understood by reference to the following description taken in conjunction with the accompanying drawings in which:

FIG. 3 is a flowchart of steps performed in an exemplary process for fabricating a SiC Schottky diode according to one embodiment.

It should be noted that like reference numbers refer to like elements in the figures.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Figure 1A:
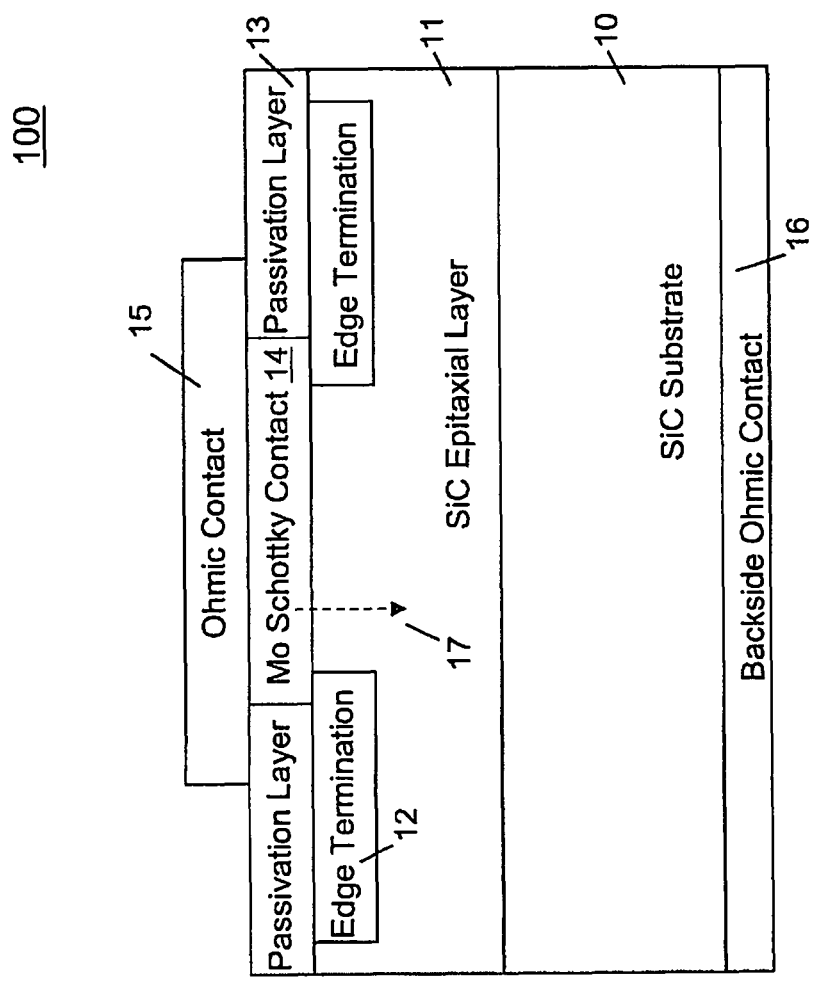
FIG. 1A is a block diagram of a cross-section of a portion of a silicon carbide (SiC) Schottky barrier diode (SBD) fabricated according to one embodiment.

Molybdenum Barrier Metal for SiC Schottky Diode and Process of Manufacture According to One Embodiment of the Present Invention FIG. 1A shows a cross-section of a silicon carbide (SiC) Schottky barrier diode (SBD) 100 fabricated according to one embodiment of the invention. In one embodiment, a molybdenum (Mo) Schottky contact is used that provides an improvement, as compared to titanium (Ti) and other materials, in forward current conduction and reverse voltage blocking performance. Additionally, the Mo Schottky contact provides greater operating stability at high temperatures and allows a higher annealing temperature than does SiC Schottky diodes that use titanium (Ti) or nickel (Ni) Schottky contacts.

In the FIG. 1A embodiment, SiC-SBD 100 includes silicon carbide (SiC) substrate 10, SiC epitaxial layer 11, edge termination implants 12, passivation layer 13, molybdenum (Mo) contact 14, ohmic contact 15 and backside ohmic contact 16. In one embodiment, passivation layer 13 may be formed from silicon dioxide ($SiO_2$), ohmic contact 15 may be formed from aluminum (Al) and backside ohmic contact 16 may be formed from nickel (Ni). In other embodiments, materials other than those discussed herein may be used to form one or more of the structures of SiC SBD 100.

Referring to FIG. 1A a high quality SiC epitaxially deposited layer (e.g., SiC epitaxial layer 11) is formed on SiC substrate 10 and an edge termination diffusion is used to form edge termination implants 12 (e.g., field ring) in SiC epitaxial layer 11. In one embodiment, portions of edge termination implants 12 are covered by passivation layer 13. In one embodiment, Mo contact 14 is formed at high temperature and is contacted by ohmic contact 15. Backside ohmic contact 16 is formed on the backside of substrate 10.

In operation, when a positive voltage is applied across the terminals represented by ohmic layer 15 and backside ohmic contact 16 forward current conduction is triggered as is shown at 17 in FIG. 1A. Conversely, when a reverse voltage is applied to terminals represented by ohmic contact 15 and backside ohmic contact 16 the SiC-SBD 100 is reverse biased and current conduction is stopped. It should be appreciated that, during device operation, the Mo contact described herein provides a more stable Schottky barrier as compared to Ti over the lifetime of SiC-SBD 100.

Fabrication Process

Initially, in one embodiment, a prepared wafer that includes a SiC substrate (e.g., 10 in FIG. 1A) and SiC epitaxial layer (e.g., 11 in FIG. 1A) may be precleaned using a 4:1.5:1.5 (volume) solution of $H_2SO_4:H_2O_2:H_2O$ at 90° C. for 10 minutes and a 4:1. 5:1.5 (volume) solution of $H_2ODI.:HCL:H_2O_2$ at 75° C. for 10 minutes. Thereafter, a low thermal oxide (LTO) tetraethyl orthosilicate (TEOS) compound may be deposited to a thickness of one micron before a first photo resist mask is applied to the surface of SiC epitaxial layer 11. This may be followed by an reactive ion etch (RIE) oxide etch.

Next, a photo resist strip may be performed using a 100:6 solution of $H_2SO_4:H_2O_2$ at 140° C. for 15 minutes. A second photo resist mask may then be applied followed by a buffer oxide etch (B.O.E.) of the structure using a 6:1 buffer chemical solution. The aforementioned operations serve to prepare the semiconductor structure for edge termination implants (e.g., 12 in FIG. 1A). Accordingly, edge termination implants may thereafter be formed.

In one embodiment, the edge termination implants (e.g., 12 in FIG. 1A) may include boron (B) implants made at a dose of 5E13 with an implantation energy of 80+190 KeV, and using a tilt angle of 4°. After the boron (B) implants are made, a backside phosphorous (P) implant made at a dose of 1E15 with implantation energy of 25+80 Kev using a tilt angle of 4° may be made to increase the Cathode surface concentration (e.g., 12 in FIG. 1A). A secondary ion mass spectrometry (SIMS) tool can by used to perform elemental and isotopic analysis of the implants.

Subsequently, a photo resist strip may be performed using a 100:6 solution of $H_2SO_4:H_2O_2$ at a temperature of 140° C. for 15 minutes. Thereafter, another buffer oxide etch (B.O.E) using a 6:1 solution may be performed. The resulting structure may be precleaned using a 4:1.5:1.5 (volume) solution of $H_2SO_4:H_2O_2:H_2O$ at 90° C. for 10 minutes and a 4:1.5:1.5 (volume) solution of $H_2ODI.:HCL:H_2O_2$ at 75° C. for 10 minutes. Next, the edge termination implants (e.g., 12 in FIG. 1A) may be annealed, to activate the implanted dopants using high temperature rapid termination annealing (HTRTA) at a temperature that is greater than 1550° C. (in order to activate the ions implanted in the SiC epitaxial layer 11). In one embodiment, the use of HTRTA avoids degradation of SiC material which can degrade the performance of the completed device.

Subsequently, another preclean operation may be performed using a 4:1.5:1.5 (volume) solution of H2SO4: H2O2:H2O at 90° C. for 10 minutes and a 4:1.5:1.5 (volume) solution of H2ODI.:HCL:H2O2 at 75° C. for 10 minutes. In order to provide a polished surface, a low thermal oxide (LTO) TEOS deposition may be performed. Subsequently, sacrificial oxidation may be performed which may be followed by an oxide strip.

Thereafter, a preclean operation may be performed using a 4:1.5:1.5 (volume) solution of H2SO4:H2O2:H2O at 90° C. for 10 minutes and a 4:1.5:1.5 (volume) solution of H2ODI.:HCL:H2O2 at 75° C. for 10 minutes. Next, a low thermal oxide (LTO) TEOS deposition having a thickness of 1 micron may be performed (which provides passivation where TEOS is formed on the termination implant area). And, subsequently a TEOS oxidation may be performed. In one embodiment, the TEOS oxidation results in improved electrical properties as the oxide interface is maintained compact through these processes.

Next, operations that remove material and prepare the semiconductor structure (provide a contact opening) for metal deposition may be performed. The operations include the formation of a photo resist mask (third), the performance of a B.O.E. oxide etch (using a 6:1 buffer chemical solution), the performance of a photo resist strip (using a 100:6 solution of H2SO4:H2O2 at 140° C. for 15 minutes), the performance of a preclean operation (using a 4:1.5:1.5 volume solution of H2SO4:H2O2:H2O at 90° C. for 10 minutes and a 4:1.5:1.5 volume solution of H2ODI.:HCL: H2O2 at 75° C. for 10 minutes), and the performance of a B.O.E. clean. Back side ohmic contact may be formed on the cathode area using a selection of thin metal layer such us Ni or Ni—Al and subsequent temperature annealing in the range of 800-1000° C. to reduce the contact resistance After the aforementioned operations have been performed a molybdenum Schottky barrier (e.g. Mo Schottky contact 14 in FIG. 1A) may be formed in the contact opening and an ohmic, e.g., nickel (Ni), gold (Au), copper (Cu), etc., frontside metal contact (e.g., 15 in FIG. 1A) may be formed above the molybdenum Schottky barrier (e.g., contact). In one embodiment, the molybdenum Schottky barrier (e.g., contact) may be grown to a thickness of 500Å-2000° A. In one embodiment, the front ohmic contact (e.g., 15 in FIG. 1A) can be grown to a thickness of 4 microns. In one embodiment, a standard wire bonding process may used to form the ohmic frontside metal contact. In other embodiments, other processes can be used. Thereafter, a metal sinter (high temperature anneal) may be performed using a temperature in the range of 300° C. to 700° C. In other embodiments, a metal sinter may performed using temperatures in excess of 600° C. (e.g., 800° C.).

Next a photoresist mask (fourth) may be applied. Thereafter, a metal etch may be performed (for device definition) and a photo resist strip executed. Subsequently, a contact metal preclean may be performed. These operations may be followed by amorphous silicon deposition (e.g., 1900 A) and a polyimide passivation (for stable electrical characteristics and increased blocking capability).

Thereafter, a fifth photoresist mask may be applied followed by an amorphous silicon etch and a high temperature polyimide cure. Finally, a contact metal preclean and backside reinforcement metallization operations may be performed (e.g., to form backside ohmic contact 16). In one embodiment, materials used to form backside ohmic contact 16 include but are not limited to titanium (Ti) (1000A), nickel (Ni) (4000A) and silver (Ag) (6000A). In other embodiments, other metal and thicknesses selection may be used.

Figure 1B:
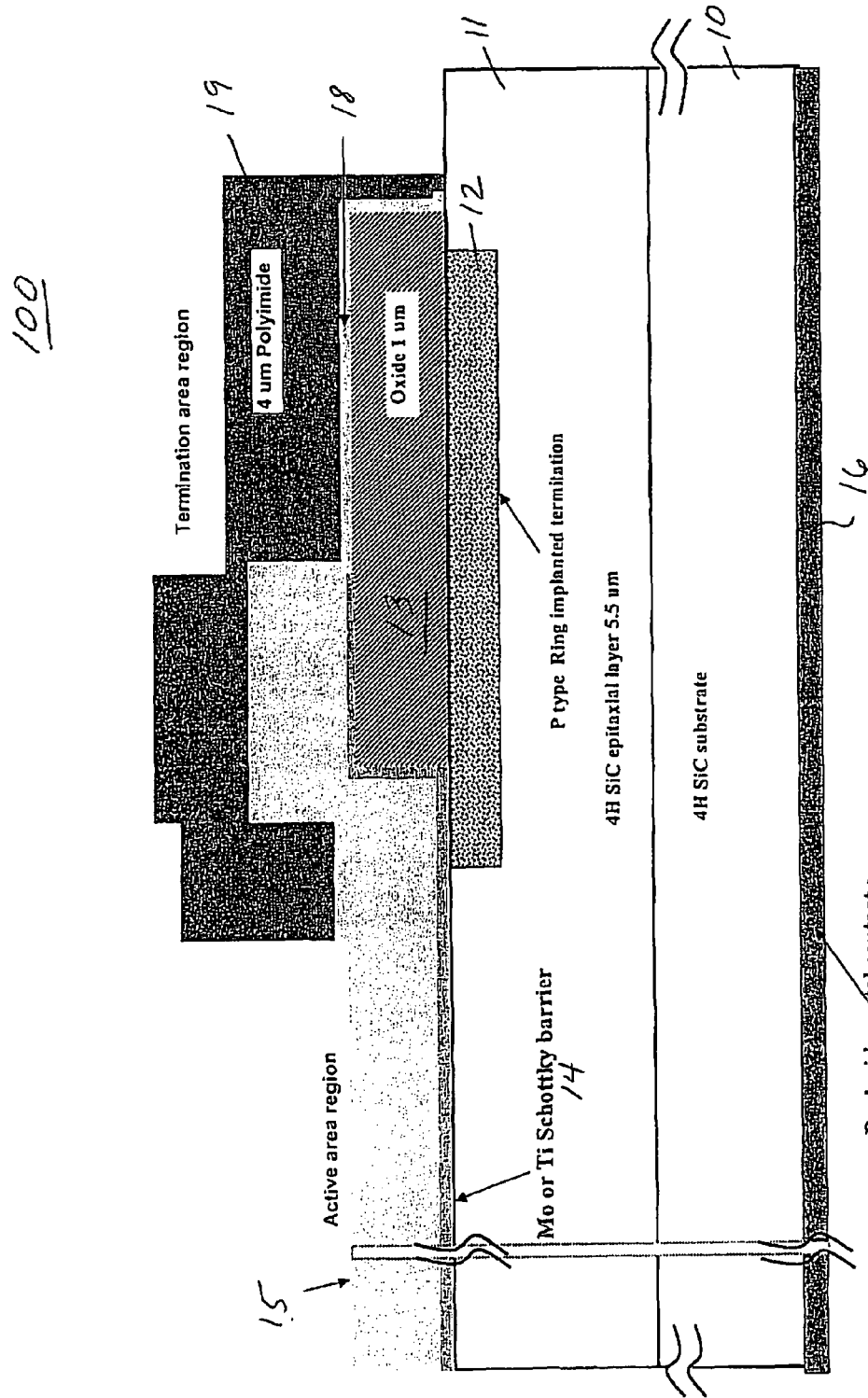
FIG. 1B shows a cross-sectional view of a completed SiC-SBD fabricated according to one embodiment.

FIG. 1B shows another cross section view of the completed device which is an embodiment of the device shown in FIG. 1A with additional details shown. Components shown in FIG. 1B but not shown in FIG. 1A include amorphous silicon layer 18 and polyimide layer 19, that are formed as discussed above.

Characteristics

Figure 2A:
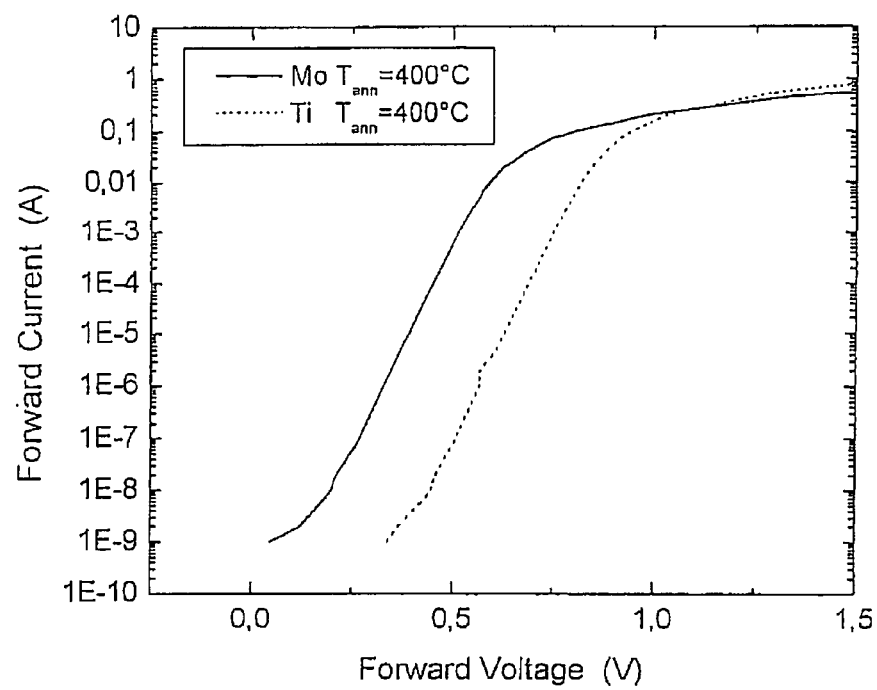
FIG. 2A is a graph that shows the forward conduction characteristics of a Schottky diode with a molybdenum (Mo) Schottky contact as compared to a Schottky diode with a titanium (Ti) Schottky contact according to one embodiment.
Figure 2B:
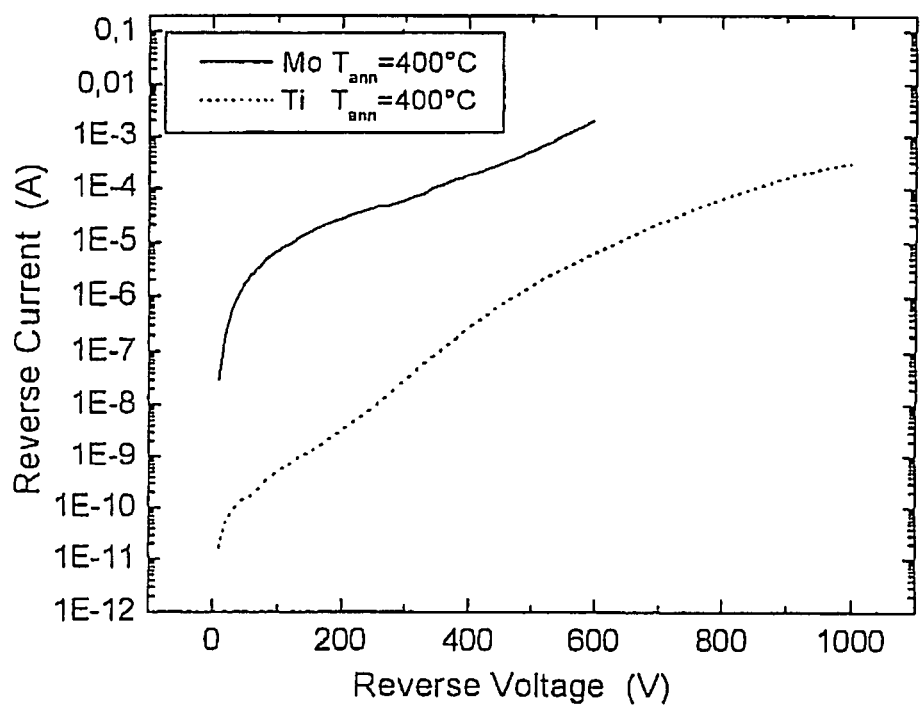
FIG. 2B is a graph that shows the reverse bias characteristics of a Schottky diode with a Mo Schottky contact as compared to a Schottky diode with a Ti Schottky contact according to one embodiment.

FIGS. 2A and 2B depict current-voltage characteristics of SiC-SBDs that have a molybdenum (Mo) Schottky contact area of 1 mm$^2$ and that are annealed at 400° C. according to one embodiment. Importantly, these graphs show that, as compared to SiC-SBDs with titanium (Ti) Schottky contacts, SiC-SBDs with molybdenum (Mo) Schottky contacts provide better forward current conduction with less forward voltage. The SBDs characterized in FIGS. 2A and 2B showed specific on-resistances ($R_{on}$) at RT calculated to be on the order of 1.5 mΩcm$^2$, and breakdown voltages (Vb) in excess of 600 V.

A high temperature annealed Mo SiC-SBDs such as is shown in FIG. 1A may be evaluated using $V_b^2/R_{on}$. This value is generally used as a figure of merit for SiC-SBDs. High performance SiC-SBDs possess higher $V_b^2/R_{on}$ values than lower performance SiC-SBDs. The $V_b^2/R_{on}$ values for evaluated embodiments of the present invention were 1898 MW/cm$^2$ for devices with Schottky contact areas of 1 mm$^2$.

The following Table A shows experimental results, employing Mo, Ti, and Ni Schottky contact layers at different temperatures.

TABLE A

| Schottky Contact | Barrier Height from IV (eV) | Ideality Factor | Barrier Height from CV (ev) | ND (cm$^{-3}$) | Ir @ 600 V |
|---|---|---|---|---|---|
| Mo | 0.91 | 1.07 | 1.10 | 1.32E16 | 1000 μA |
| Mo | 0.97 | 1.05 | 1.15 | 1.74E16 | 1000 μA |
| Mo | 1.10 | 1.05 | 1.21 | 1.26E16 | 100 μA |
| Ti | 0.85 | 1.04 | 0.91 | 1.12E16 | 100 μA |
| Ti | 1.20 | 1.03 | 1.21 | 9.85E15 | 20 μA |
| Ni | 1.45 | 1.10 | 1.65 | 9.91E15 | 100 μA |
| Ni | 1.52 | 1.12 | 1.72 | 1.16E16 | 50 μA |

In exemplary embodiments, a high temperature (>600° C.) annealed Molybdenum (Mo) Schottky contact is provided that has superior properties (Schottky barrier height=1.2-1.3 eV and ideality factor<1.1) for reduction of power loss in a high-voltage SiC-SBD. The Schottky barrier height indicates the difference of potentials at an interface between a metal and a semiconductor. This parameter is important in the determination of device forward voltage and leakage current. The ideality factor provides a measure of the quality of the interface. In general, the ideality factor is from 1 to 2, this parameter being below 1.1 in a high quality interface.

In one embodiment, electronic power devices such as 4H—SiC junction-barrier Schottky (JBS) diodes that include a Schottky barrier (SB) as disclosed herein may be fabricated on 3 inch diameter 4H—SiC wafers. Schottky metal contacts may be obtained by thermal and e-beam evaporation of Ti, Mo and Ni.

In one embodiment, the disclosed Schottky diode exhibits a blocking voltage of up to 1000V at room temperature and in the range of 77-400° K. In one embodiment, characteristics of the Schottky diode were evaluated with reference to current—voltage and capacitance—voltage measurements. The Schottky Barrier heights (SBH), the ideality factors, and the reverse leakage current on different designs, were measured and a morphological study related to the structure of failed devices was performed by high resolution scanning electron microscopy.

In one embodiment, Schottky barrier diodes with Mo as the Schottky barrier exhibit a blocking voltage similar to that obtained by standard Ti metallization but with a lower height barrier value. A consequence of the lower barrier value is a better performance in forward conduction as is shown in FIG. 2A as well as in reverse or blocking voltage as shown in FIG. 2B.

Junction barrier Schottky (JBS) diodes limit the electric field strength on the Schottky barrier and thus also limit Schottky barrier lowering and reverse current flow.

Method for Frabicating SiC Schottky Diode According to One Embodiment

FIG. 3 is a flowchart of steps performed in an exemplary process for fabricating a silicon carbide (SiC) Schottky diode according to one embodiment of the present invention. Although specific steps are disclosed in the flowcharts, such steps are intended as exemplary. Moreover, embodiments may be well suited to performing various other steps or variations of the steps disclosed in the flowcharts. Within various embodiments, it should be appreciated that the steps of the flowcharts may be able to be performed by various methods.

At step 301, a substrate is formed. In one embodiment, the substrate is formed of SiC. At step 303, an epitaxial layer is formed on the substrate. In one embodiment, the epitaxial layer is formed of SiC (high quality).

At step 305, a termination implant is formed in a termination region of said epitaxial layer. In one embodiment, the field ring is formed by edge termination diffusion. Thereafter a back side ohmic contact may be formed on a cathode area using a selection of thin metal layer such us Ni or Ni—Al and subsequent temperature annealing in the range of 800-1000° C. to reduce the contact resistance.

At step 307, a Schottky contact is formed on the epitaxial layer. In one embodiment, the Schottky contact comprises a layer of molybdenum.

At step 309, a Schottky contact is annealed at a temperature in the range of 300 to 700° C. At step 311, an ohmic contact layer is formed above the Schottky contact. In one embodiment, the ohmic contact may include but is not limited to aluminum, copper or gold. At step 313 an ohmic contact is formed on the backside of the substrate.

With reference to exemplary embodiments thereof, a method for fabricating a diode is disclosed. In one embodiment, the method includes forming a Schottky contact on an epitaxial layer of silicon carbide (SiC) and annealing the Schottky contact at a temperature in the range of 300 to 700° C. The Schottky contact is formed of a layer of molybdenum.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

I claim:

1. A method for fabricating a diode, said method comprising:
   forming a Schottky contact on an epitaxial layer of silicon carbide (SiC) wherein a ring termination region is formed in said epitaxial layer of silicon carbide (SiC) below a passivation layer, and wherein said Schottky contact comprises a layer of molybdenum (Mo);
   annealing said Schottky contact at a temperature in the range of 300° C. to 700° C.;
   forming an ohmic contact that contacts said passivation layer and said Schottky contact and overlies portions of said ring termination region;
   forming a layer of amorphous silicon that has a top surface that fully lies underneath and contacts a bottom surface of said ohmic contact and a side surface of said passivation layer wherein at least a portion of said bottom surface of said ohmic contact lies above a structure other than said amorphous silicon; and
   forming a polyimide layer over said layer of amorphous silicon and over said Schottky contact wherein said layer of amorphous silicon contacts portions of said Schottky contact.

2. The method of claim 1 wherein said forming a Schottky contact that is comprised of Mo provides said diode with greater forward current conduction with less forward voltage applied than a similar diode with a Schottky contact that comprises titanium (Ti).

3. The method of claim 1 further comprising forming an ohmic contact above said layer of molybdenum wherein material used to form said ohmic contact is selected from the group consisting of aluminum (Al), nickel (Ni), titanium (Ti), tungsten (W), copper (Cu) and gold (Au).

4. The method of claim 3 wherein said ohmic contact is formed using a wire bonding process and comprises an aluminum top layer formed over a molybdenum barrier metal which are annealed together during the Schottky contact annealing step using a temperature in the range of 300-700° C.

5. The method of claim 1 further comprising forming a boron termination implant in said epitaxial layer of SiC.

6. The method of claim 5 wherein said boron termination implant is formed using high temperature rapid thermal annealing (HTRTA) with temperature in excess of 1550° C.

7. The method of claim 1 further comprising forming a backside phosphorous termination implant in said epitaxial layer of SiC.

8. The method of claim 1 wherein said layer of molybdenum (Mo) has a thickness that is between 500 angstroms and 2000 angstroms.

9. A method for fabricating a diode, said method comprising:
   forming a substrate;
   forming an epitaxial layer of silicon carbide on said substrate;
   forming an edge termination implant in an edge termination region of said epitaxial layer of silicon carbide (SiC) below a passivation layer;

forming a Schottky contact on said epitaxial layer wherein said Schottky contact comprises a layer of molybdenum (Mo);

annealing said Schottky contact at a temperature in the range of 300° C. to 700° C.;

forming an ohmic contact layer above said Schottky contact that contacts said passivation layer and said Schottky contact and overlies portions of said edge termination implant;

forming a backside ohmic contact on a backside of said substrate;

forming a layer of amorphous silicon that has a top surface that fully lies underneath and contacts a bottom surface of said ohmic contact and a side surface of said passivation layer wherein at least a portion of said bottom surface of said ohmic contact lies above a structure other than said amorphous silicon; and forming a polyimide layer to contact top and side surfaces of said ohmic contact and a surface of said layer of amorphous silicon and over said Schottky contact wherein said layer of amorphous silicon contacts portions of said Schottky contact.

10. The method of claim 9 wherein said forming said Schottky contact that is comprised of Mo provides said diode with greater forward current conduction with less forward voltage applied than a similar diode with a Schottky contact that comprises titanium (Ti).

11. The method of claim 9 wherein material used to form said ohmic contact is selected from the group consisting of aluminum (Al), nickel (Ni), titanium (Ti), tungsten (W), copper (Cu) and gold (Au).

12. The method of claim 11 wherein said ohmic contact is formed using a wire bonding process and comprises an aluminum top layer formed over a molybdenum barrier metal which are annealed together during the Schottky contact annealing step using a temperature in the range of 300-700° C.

13. The method of claim 9 further comprising forming a boron (B) termination implant in said epitaxial layer of SiC.

14. The method of claim 13 wherein said boron (B) termination implant is formed by high temperature rapid thermal annealing activation (HTRTA).

15. The method of claim 9 further comprising forming a backside phosphorous (P) implant in said epitaxial layer of SiC.

16. The method of claim 9 wherein said layer of molybdenum (Mo) has a thickness that is between 500 angstroms and 2000 angstroms.

17. A Schottky diode comprising:
a substrate;
an epitaxial layer located adjacent to and above said substrate;
an edge termination implant formed in a termination region of said epitaxial layer below a passivation layer;
a Schottky contact formed on said epitaxial layer, wherein said Schottky contact comprises a layer of molybdenum;
an ohmic contact formed above said Schottky contact that contacts said passivation layer and said Schottky contact and overlies portions of said termination region;
a backside ohmic contact formed on a backside of said substrate;
forming a layer of amorphous silicon that has a top surface that fully lies underneath and contacts a bottom surface of said ohmic contact and a side surface of said passivation layer wherein at least a portion of said bottom surface of said ohmic contact lies above a structure other than said amorphous silicon; and
a polyimide layer formed to contact top and side surfaces of said ohmic contact and a surface of said layer of amorphous silicon and over said Schottky contact wherein said layer of amorphous silicon contacts portions of said Schottky contact.

18. The diode of claim 17 wherein said diode provides greater forward current conduction with less forward voltage applied than a similar diode comprising a Schottky contact made of titanium.

19. The diode of claim 17 further comprising an ohmic contact located above said layer of molybdenum wherein material used to form said ohmic contact is selected from the group consisting of aluminum (Al), nickel (Ni), titanium (Ti), tungsten (W), copper (Cu) and gold (Au).

20. The diode of claim 19 wherein said ohmic contact is formed using a wire bonding process and comprises an aluminum top layer formed over a molybdenum barrier metal which are annealed together during the Schottky contact annealing step using a temperature in the range of 300-700° C.

21. The diode of claim 17 further comprising forming a boron (B) termination implant in said epitaxial layer of SiC.

22. The diode of claim 20 wherein said boron (B) termination implant is formed using (HTRTA) high temperature rapid thermal annealing with a temperature in excess of 1550° C.

23. The diode of claim 17 further comprising forming a backside phosphorous (P) termination implant in said epitaxial layer of SiC.

24. The diode of claim 17 wherein said layer of molybdenum (Mo) has a thickness that is between 500 angstroms and 2000 angstroms.

* * * * *